United States Patent
Fox et al.

(10) Patent No.: US 8,563,414 B1
(45) Date of Patent: Oct. 22, 2013

(54) METHODS FOR FORMING CONDUCTIVE CARBON FILMS BY PECVD

(75) Inventors: Keith Fox, Tigard, OR (US); Dennis Hausmann, Lake Oswego, OR (US)

(73) Assignee: Novellus Systems, Inc., Fremont, CA (US)

( * ) Notice: Subject to any disclaimer, the term of this patent is extended or adjusted under 35 U.S.C. 154(b) by 324 days.

(21) Appl. No.: 12/766,721

(22) Filed: Apr. 23, 2010

(51) Int. Cl.
C23C 8/54 (2006.01)
C23C 14/28 (2006.01)

(52) U.S. Cl.
USPC .......... 438/590; 427/569; 427/577; 427/585; 427/595; 423/364

(58) Field of Classification Search
USPC .......... 423/364; 427/569, 577, 585, 590, 595
See application file for complete search history.

(56) References Cited

U.S. PATENT DOCUMENTS

| | | | |
|---|---|---|---|
| 3,816,976 A | 6/1974 | Stork et al. | |
| 4,209,357 A | 6/1980 | Gorin et al. | |
| 4,274,841 A | 6/1981 | Andersen et al. | |
| 4,668,261 A | 5/1987 | Chatzipetros et al. | |
| 4,863,493 A | 9/1989 | Kotani et al. | |
| 4,863,760 A | 9/1989 | Schantz et al. | |
| 4,975,144 A * | 12/1990 | Yamazaki et al. | 216/67 |
| 5,222,549 A | 6/1993 | Ishii et al. | |
| 5,231,057 A | 7/1993 | Doki et al. | |
| 5,261,250 A | 11/1993 | Missimer | |
| 5,378,316 A | 1/1995 | Franke et al. | |
| 5,470,661 A | 11/1995 | Bailey et al. | |
| 5,562,952 A | 10/1996 | Nakahigashi et al. | |
| 5,670,066 A | 9/1997 | Barnes et al. | |
| 5,792,269 A | 8/1998 | Deacon et al. | |
| 5,985,103 A | 11/1999 | Givens et al. | |
| 6,006,797 A | 12/1999 | Bulow et al. | |

(Continued)

FOREIGN PATENT DOCUMENTS

| FR | 2853313 | 10/2004 |
|---|---|---|
| JP | 62019539 | 1/1987 |

(Continued)

OTHER PUBLICATIONS

Jacobsohn, et al., Hydrogenated Carbon-Nitrogen Films Obtained by PECVD Using Acetylene and Nitrogen as Precursor Gases, Mat. Res. Soc. Symp. Proc. 1998; 498: 283-288.*

(Continued)

*Primary Examiner* — Daniel C McCracken
(74) *Attorney, Agent, or Firm* — Weaver Austin Villeneuve & Sampson LLP (57) ABSTRACT

Conductive carbon films having a resistivity of less than about 0.2 Ohm-cm, preferably less than about 0.05 Ohm-cm, are deposited by PECVD. Conductive carbon films are essentially free of $sp^3$-hybridized carbon and contain predominantly $sp^2$ carbon, based on IR spectral features. Carbon content of the films is at least about 75% atomic C. Conductive carbon films may contain hydrogen, but are typically hydrogen-poor, containing less than about 20% H. In some embodiments, conductive carbon films further contain nitrogen (N). For example, conductive films having a $C_xH_yN_z$ composition, where nitrogen is present at between about 5-10% atomic, have both high conductivity and low roughness, because introduction of nitrogen delays formation of crystallites in the film. The films are deposited at a process temperature of at least about 620° C., and at a pressure of less than about 20 Torr in a dual-frequency plasma process dominated by low frequency (LF) plasma.

18 Claims, 9 Drawing Sheets

(56) References Cited

U.S. PATENT DOCUMENTS

| | | |
|---|---|---|
| 6,030,591 A | 2/2000 | Tom et al. |
| 6,035,803 A | 3/2000 | Robles et al. |
| 6,041,734 A | 3/2000 | Raoux et al. |
| 6,066,209 A | 5/2000 | Sajoto et al. |
| 6,150,719 A | 11/2000 | Saia et al. |
| 6,241,793 B1 | 6/2001 | Lee et al. |
| 6,286,321 B1 | 9/2001 | Glater |
| 6,319,299 B1 | 11/2001 | Shih et al. |
| 6,331,480 B1 | 12/2001 | Tsai et al. |
| 6,367,413 B1 | 4/2002 | Sill et al. |
| 6,465,051 B1 | 10/2002 | Sahin et al. |
| 6,478,924 B1 | 11/2002 | Shamouilian et al. |
| 6,541,397 B1 | 4/2003 | Bencher |
| 6,573,030 B1 | 6/2003 | Fairbairn et al. |
| 6,617,553 B2 | 9/2003 | Ho et al. |
| 6,635,185 B2 | 10/2003 | Demmin |
| 6,777,349 B2 | 8/2004 | Fu et al. |
| 6,967,072 B2 | 11/2005 | Latchford et al. |
| 7,220,982 B2 | 5/2007 | Campbell |
| 7,223,526 B2 | 5/2007 | Fairbairn et al. |
| 7,314,506 B2 | 1/2008 | Vininski et al. |
| 7,323,401 B2 | 1/2008 | Ramaswamy et al. |
| 7,381,644 B1 | 6/2008 | Subramonium et al. |
| 7,495,984 B2 | 2/2009 | Kim et al. |
| 7,576,006 B1 | 8/2009 | Yu et al. |
| 7,820,556 B2 | 10/2010 | Hsu et al. |
| 7,915,166 B1 | 3/2011 | Yu et al. |
| 7,955,990 B2 | 6/2011 | Henri et al. |
| 7,981,777 B1 | 7/2011 | Subramonium et al. |
| 7,981,810 B1 | 7/2011 | Subramonium et al. |
| 8,110,493 B1 | 2/2012 | Subramonium et al. |
| 8,309,473 B2 | 11/2012 | Hsu et al. |
| 8,435,608 B1 | 5/2013 | Subramonium et al. |
| 2001/0021491 A1 | 9/2001 | Chen et al. |
| 2002/0182848 A1 | 12/2002 | Joseph et al. |
| 2003/0044532 A1 | 3/2003 | Lee et al. |
| 2003/0106647 A1 | 6/2003 | Koshiishi et al. |
| 2004/0016972 A1 | 1/2004 | Singh et al. |
| 2004/0018750 A1 | 1/2004 | Sophie et al. |
| 2004/0023502 A1 | 2/2004 | Tzou et al. |
| 2004/0140506 A1 | 7/2004 | Singh et al. |
| 2004/0180551 A1 | 9/2004 | Biles et al. |
| 2004/0224504 A1 | 11/2004 | Gadgil |
| 2004/0266195 A1 | 12/2004 | Dokumaci et al. |
| 2005/0042889 A1 | 2/2005 | Lee et al. |
| 2005/0098119 A1 | 5/2005 | Burger et al. |
| 2005/0112506 A1 | 5/2005 | Czech et al. |
| 2005/0130404 A1 | 6/2005 | Moghadam et al. |
| 2005/0167394 A1 | 8/2005 | Liu et al. |
| 2005/0260411 A1 | 11/2005 | Ravi |
| 2006/0091559 A1 | 5/2006 | Nguyen et al. |
| 2006/0154086 A1 | 7/2006 | Fuller et al. |
| 2006/0197881 A1 | 9/2006 | Kang et al. |
| 2006/0205223 A1 | 9/2006 | Smayling |
| 2007/0032054 A1 | 2/2007 | Ramaswamy et al. |
| 2007/0048674 A1 | 3/2007 | Wells |
| 2007/0054500 A1 | 3/2007 | Bencher |
| 2007/0059913 A1 | 3/2007 | King et al. |
| 2007/0077780 A1 | 4/2007 | Wang et al. |
| 2007/0105303 A1 | 5/2007 | Busch et al. |
| 2007/0125762 A1 | 6/2007 | Cui et al. |
| 2007/0128538 A1 | 6/2007 | Fairbairn et al. |
| 2007/0140029 A1 | 6/2007 | Kim et al. |
| 2007/0166546 A1 | 7/2007 | Ichikawa et al. |
| 2007/0166979 A1 | 7/2007 | Wang et al. |
| 2007/0202640 A1 | 8/2007 | Al-Bayati et al. |
| 2007/0247073 A1 | 10/2007 | Paterson et al. |
| 2008/0073636 A1 | 3/2008 | Kim |
| 2008/0083916 A1 | 4/2008 | Kim |
| 2008/0128907 A1 | 6/2008 | Yang et al. |
| 2008/0200003 A1 | 8/2008 | Hong et al. |
| 2008/0242912 A1 | 10/2008 | Letessier et al. |
| 2008/0254641 A1 | 10/2008 | Kobayashi et al. |
| 2008/0264803 A1 | 10/2008 | Agrawal |
| 2009/0182180 A1 | 7/2009 | Huang et al. |
| 2009/0305516 A1 | 12/2009 | Hsu et al. |
| 2010/0151691 A1 | 6/2010 | Henri et al. |
| 2010/0297853 A1 | 11/2010 | Hsu et al. |
| 2012/0149207 A1 | 6/2012 | Graff |
| 2012/0196446 A1 | 8/2012 | Graff |

FOREIGN PATENT DOCUMENTS

| | | |
|---|---|---|
| JP | 08152262 | 6/1996 |
| SU | 382671 | 5/1973 |
| WO | 2005/048367 | 5/2005 |

OTHER PUBLICATIONS

Muhl, et al., A review of the preparation of carbon nitride films, Diamond and Related Materials 1999; 8: 1809-1830.* van de Ven, et al., Advantages of Dual Frequency PECVD for Deposition of ILD and Passivation Films, VLSI Multilevel Interconnection Conference Proceedings, Seventh International IEEE; 1990: 194-201.*

US Notice of Allowance and Fee Due mailed May 7, 2007 from U.S. Appl. No. 11/318,269.

US Office Action mailed Nov. 20, 2009 issued in U.S. Appl. No. 11/710,652.

US Office Action mailed Dec. 9, 2009 issued in U.S. Appl. No. 11/612,382.

US Office Action mailed Dec. 21, 2009 issued in U.S. Appl. No. 12/133,223.

US Notice of Allowance mailed Mar. 2, 2010 issued in U.S. Appl. No. 12/133,223.

US Office Action mailed Mar. 31, 2010 issued in U.S. Appl. No. 11/710,377.

US Office Action mailed Mar. 26, 2010 issued in Appl. No. 11/612,382.

US Office Action dated Oct. 19, 2011 issued in U.S. Appl. No. 12/163,670.

US Office Action dated Nov. 9, 2011 issued in U.S. Appl. No. 12/786,842.

US Notice of Allowance dated Oct. 7, 2011 issued in U.S. Appl. No. 12/048,967.

Holmes et al., "Trimethylsilylacetylene", Organic Syntheses, Coll. vol. 8, p. 606 (1993); vol. 65, p. 61 (1987).

Voronkin et al., Structure and mechanical properties of a-C:H films deposited onto polymer substrates:, Diamond and Related Materials, 4 (1994) 5-9.

US Office Action dated Feb. 14, 2012 issued in U.S. Appl. No. 12/163,670.

US Final Office Action dated Apr. 19, 2012 issued in U.S. Appl. No. 12/786,842.

U.S. Appl. No. 13/160,399, filed Jun. 14, 2011, entitled "Methods of Depositing Highly Selective Transparent Ashable Hardmask Films".

US Office Action, dated Aug. 27, 2007, issued in U.S. Appl. No. 11/318,269.

US Notice of Allowance, dated Jan. 7, 2008, issued in U.S. Appl. No. 11/318,269.

US Office Action, dated Nov. 22, 2010, issued in U.S. Appl. No. 12/048,967.

US Office Action, dated Dec. 30, 2010, issued in U.S. Appl. No. 11/449,983.

US Office Action, dated Jun. 1, 2007, issued in U.S. Appl. No. 11/612,382.

U.S. Appl. No. 13/032,392, filed Feb. 22, 2011, entitled "Improved Diffusion Barrier and Etch Stop Films".

US Notice of Allowance, dated Mar. 22, 2011, issued in U.S. Appl. No. 11/710,377.

US Office Action, dated Sep. 3, 2010, issued in U.S. Appl. No. 11/849,208.

US Final Office Action, dated Apr. 12, 2011, issued in U.S. Appl. No. 11/849,208.

US Final Office Action, dated Sep. 14, 2012, issued in U.S. Appl. No. 11/849,208.

US Office Action, dated Jul. 6, 2012, issued in U.S. Appl. No. 12/163,670.

(56) References Cited

OTHER PUBLICATIONS

US Final Office Action dated Oct. 18, 2012, issued in U.S. Appl. No. 12/163,670.
US Notice of Allowance, dated Jul. 20, 2012, issued in U.S. Appl. No. 12/786,842.
Korean Office Action, dated Jun. 1, 2010, issued in Application No. 2009/0048358.
US Office Action dated Oct. 24, 2012 issued in U.S. Appl. No. 12/756,731.
US Final Office Action, dated May 7, 2013, issued in U.S. Appl. No. 12/756,731.
U.S. Appl. No. 13/856,364, filed Apr. 3, 2013, entitled "Methods of Depositing Smooth and Conformal Ashable Hard Mask Films".
US Notice of Allowance, dated Oct. 4, 2006, issued in U.S. Appl. No. 11/318,269.
US Office Action, dated Apr. 18, 2011, issued in U.S. Appl. No. 12/048,967.
US Notice of Allowance, dated Mar. 16, 2011, issued in U.S. Appl. No. 11/449,983.
US Office Action, dated Jun. 21, 2010, issued in U.S. Appl. No. 11/449,983.
US Final Office Action, dated Apr. 24, 2013, issued in U.S. Appl. No. 11/849,208.
US Notice of Allowance dated Jan. 3, 2013, issued in U.S. Appl. No. 12/163,670.
US Notice of Allowance, dated Nov. 2, 2010, issued in U.S. Appl. No. 11/449,983.
US Supplemental Notice of Allowance, dated Feb. 8, 2011, issued in U.S. Appl. No. 12/334,220.
US Office Action, dated Feb. 15, 2013, issued in U.S. Appl. No. 13/371,184.
U.S. Office Action mailed Dec. 14, 2006, from U.S. Appl. No. 11/318,269.
Ikeda et al., "Top-PECVD": A New Conformal Plasma Enhanced CVD Technology using TEOS, Ozone and Pulse-modulated RF Plasma,' 1992 IEEE, pp. 11.2.-11.2.4.
Subramonium et al., "Methods of Depositing Highly Selective Transparent Ashable Hardmask Films", U.S. Appl. No. 11/449,983, filed Jun. 8, 2006.
Subramonium et al., "Methods of Depositing Stable and Hermetic Ashable Hardmask Films," Novellus Systems, Inc., U.S. Appl. No. 11/710,377, filed Feb. 22, 2007, pp. 1-26.
Notice of Allowance and Fee Due mailed May 7, 2007 from U.S. Appl. No. 11/318,269.
Allowed Claims from U.S. Appl. No. 11/318,269, Nov. 19, 2007.
Fang et al., "Methods of Improving Ashable Hardmask Adhesion to Metal layers," Novellus Systems, Inc., U.S. Appl. No. 11/612,382, filed Dec. 18, 2006.
U.S. Office Action mailed Oct. 9, 2007, from U.S. Appl. No. 11/612,382.
Grill, et al. "Diamondlike carbon films by rf plasma-assisted chemical vapor deposition from acetylene," IBM J. Res. Develop., vol. 34, No. 6, Nov. 1990, pp. 849-857.
Callegari et al., "Optical properties of hydrogenated amorphous-carbon film for attenuated phase-shift mask applications," J.Vac. Sci. Technol. B 11(6), Nov./Dec. 1993, pp. 2697-2699.

Grill, A., "Diamond-like carbon: state of the art," Diamond and Related Matcials 8 (1999) 428-434.
Grill, A., "Plasma-deposited diamondlike carbon and related materials," IBM Journal of Research and Development, vol. 43, ½, 1999, http://research.ibm.com/journal/rd/431/grill.html. 14 pages.
Kragler et al., "Scanning tunneling microscopy based lithography employing amorphous hydrogenated carbon as a high resolution resist mask," Appl. Phys. Lett. 67 (8), Aug. 21, 1995, pp. 1163-1165.
U.S. Office Action mailed Dec. 27, 2007, from U.S. Appl. No. 11/449,983.
Subramonium et al., "Pulsed PECVD Method for Modulating Hydrogen Content in Hard Mask," Novellus Systems, Inc., U.S. Appl. No. 12/048,967, filed Mar. 14, 2008.
Subramonium et al., "Methods and Apparatus for Plasma-Based Deposition," Novellus Systems, Inc., U.S. Appl. No. 11/849,208, filed Aug. 31, 2007.
U.S. Office Action mailed Jul. 9, 2008, from U.S. Appl. No. 11/449,983.
U.S. Final Office Action mailed May 13, 2008, from U.S. Appl. No. 11/612,382.
U.S. Office Action mailed Aug. 19, 2008, from U.S. Appl. No. 11/612,382.
Subramonium et al., "Methods of Depositing Smooth and Conformal Ashable Hard Mask Films," Novellus Systems, Inc., U.S. Appl. No. 12/163,670, filed Jun. 27, 2008.
Hsu et al., "Method for Purifying Acetylene Gas for Use in Semiconductor Processes," Novellus Systems, Inc., U.S. Appl. No. 12/133,223, filed Jun. 4, 2008.
U.S. Office Action mailed Jan. 5, 2009, from U.S. Appl. No. 11/449,983.
U.S. Office Action mailed Jan. 5, 2009, from U.S. Appl. No. 11/710,377.
Henri, et al., Method for Improved Thickness Repeatability of PECVD Deposited Carbon Films, Novellus Systems, Inc., U.S. Appl. No. 12/334,220, filed Dec. 12, 2008.
U.S. Apl. No. 11/612,382, Office Action mailed Feb. 24, 2009.
U.S. Appl. No. 11/612,382, Office Action mailed May 12, 2009.
U.S. Appl. No. 11/710,377, Office Action mailed Aug. 19, 2009.
U.S. Appl. No. 12/133,223, Office Action mailed Aug. 19, 2009.
U.S. Appl. No. 11/449,983, Office Action mailed Sep. 15, 2009.
U.S Appl. No. 11/710,652, Office Action mailed Nov. 20, 2009.
U.S. Appl. No. 11/612,382, Office Action mailed Dec. 9, 2009.
U.S. Appl. No. 12/133,223, Office Action mailed Dec. 21, 2009.
U.S. Appl. No. 12/133,223, Notice of Allowance mailed Mar. 2, 2010.
U.S. Appl. No. 12/133,223, Allowed Claims, Dec. 19, 2010.
U.S Appl. No. 11/710,377, Office Action mailed Mar. 31, 2010.
U.S. Appl. No. 11/612,382, Office Action mailed Mar. 26, 2010.
Franz Kreupl et al., "Carbon-Based Resistive Memory", IEDM , 2008.
Yu et al., U.S. Patent Application entitled: "Improved Diffusion Barrier and Etch Stop Films", U.S. Appl. No. 11/710,652, filed Feb. 22, 2007.
Henri et al., U.S. Patent Application entitled: "Carbon Film for Resistive Memory", U.S. Appl. No. 12/756,731, filed Apr. 8, 2010.

* cited by examiner

METHODS FOR FORMING CONDUCTIVE CARBON FILMS BY PECVD

FIELD OF THE INVENTION

The present invention pertains to plasma enhanced chemical vapor deposition (PECVD) methods. Specifically, the invention pertains to deposition of conductive carbon films by PECVD in semiconductor processing.

BACKGROUND OF THE INVENTION

PECVD is often a method of choice for depositing various layers of material in semiconductor processing. In a typical PECVD reactor, one or more volatile precursors are introduced into the process chamber, which is typically maintained under vacuum. After the plasma is ignited within the chamber, the precursors react to deposit a layer of material on a substrate. A variety of layers used in integrated circuit (IC) fabrication can be deposited by PECVD, including inter-layer dielectrics (ILDs), diffusion barrier layers, etch stop layers and various hardmasks. For example, silicon carbide (SiC), silicon nitride (SiN), and carbon (C) layers are often deposited by PECVD.

PECVD-deposited carbon layers have been commonly used as ashable hardmasks (AHMs) in integrated circuit fabrication, where they are employed during patterning of underlying dielectric layers. After the patterning of dielectric is completed, the carbon hardmask is typically removed by ashing.

Conventional PECVD-deposited carbon AHMs usually contain significant amount of hydrogen (H) in addition to carbon, are typically rich in $sp^3$ carbon, and are substantially non-conductive.

SUMMARY OF THE INVENTION

In one aspect, a method of depositing conductive carbon films by PECVD is provided. The deposited films have a resistivity of less than about 0.2 Ohm-cm, such as less than about 0.05 Ohm-cm, e.g., in some embodiments, from between about 0.001 Ohm-cm to about 0.01 Ohm-cm, which is comparable to resistivity of doped polysilicon.

Further, processes for depositing conductive carbon films having low surface roughness are provided, where the processes include, in some embodiments, introduction of dopants (such as N) which delay the formation of crystallites in the conductive films, and lead to smoother conductive films. In some embodiments, relatively smooth conductive films having Ra values of less than about 2 nm, such as less than about 0.5 nm are provided The conductive carbon films can be used both as sacrificial and non-sacrificial layers at various stages of integrated circuit fabrication. In some embodiments, it is advantageous to use conductive carbon films as hardmasks, because it was found that conventional non-conductive hardmasks often become charged during lithographic steps, leading to twisting and distortions in the processed substrate during patterning. In contrast, conductive carbon hardmasks can counteract charging during pattern etching steps leading to more accurate patterning of the substrate. In some embodiments, conductive carbon material provided herein is used as an electrically conductive anti-reflective coating that does not charge up during IC device fabrication, as a heat sink, or as a low-friction coating of a MEMS device or nanoMEMS device.

In other embodiments, conductive carbon films can be used in lieu of conventional conductive materials, such as in lieu of polysilicon. For example, conductive carbon films can be deposited to serve as electrodes, e.g., gate electrodes in transistors and in other switching devices, or as electrodes in capacitors and memory devices.

In some embodiments, the conductive carbon films can advantageously have a dual function, serving both as a hardmask during device fabrication, and as a conductive functional element in the resulting device.

In one exemplary embodiment, the conductive carbon film serves as a sacrificial hardmask. The processing method involves depositing the conductive carbon film onto a layer of exposed dielectric material, patterning the hardmask to expose selected portions of the underlying dielectric layer, and etching the dielectric in the presence of conductive carbon hardmask to form recessed features in the dielectric (e.g., vias and/or trenches). After the dielectric has been patterned, the conductive carbon hardmask can be removed from the substrate by any suitable technique, e.g., by ashing.

In another exemplary embodiment, the conductive carbon film is a non-sacrificial conductive layer. In one of the implementations, the conductive carbon film is used as a conductive layer in a double-sided capacitor. In one embodiment the capacitor fabrication method comprises (a) forming a conductive carbon film over a layer comprising exposed dielectric and a conductor (e.g, polysilicon), where the carbon film contacts the conductor, (b) depositing a cell dielectric layer over the conductive carbon layer; and (c) forming a second conductive layer (e.g., polysilicon layer) over the layer of cell dielectric. Each of the layers can be patterned, as needed, to form an array of capacitors on a substrate.

The provided conductive carbon films typically have a very high content of $sp^2$ carbon. In some embodiments, the deposited conductive carbon film is substantially free of $sp^3$-hybridized carbon based on IR spectrum. The carbon film may comprise hydrogen, but is preferably hydrogen-poor, e.g. with carbon content of at least about 75% atomic C and less than about 20% atomic H. In a preferred embodiment, the conductive carbon film contains at least about 80% atomic C.

In some embodiments, the conductive carbon film is further doped with an electron donor, such as N, P, As, or Sb. For example, nitrogen doped films, such as films having $C_xH_yN_z$ composition, where nitrogen content is between about 5-10% atomic are provided. It was discovered that incorporation of electron donors, such as nitrogen, decreases the resistivity of the carbon film, while simultaneously delaying formation of crystallites in the film, thereby leading to smoother films than the films formed without a dopant.

The conductive carbon films are formed by PECVD using a method comprising: (a) providing a semiconductor device substrate to a PECVD process chamber; (b) flowing a process gas comprising a hydrocarbon precursor into the PECVD process chamber; and (c) forming a dual frequency plasma at a process temperature of at least about 620° C. to deposit a conductive carbon film having a resistivity of less than about 0.2 Ohm-cm, wherein the deposited conductive carbon film is substantially free of $sp^3$-hybridized carbon based on IR spectrum.

A variety of hydrocarbon precursors can be used in the process gas, including alkanes, alkenes, and alkynes. In some embodiments, an alkyne precursor (e.g., acetylene) is preferably used. The process gas may further comprise a carrier gas, e.g., an inert gas (He, Ar, Ne, or Kr) or $H_2$. In some embodiments the carrier gas may include $N_2$. In some embodiments, the process gas further includes a dopant source, e.g., $N_2$, $NH_3$, and/or $N_2H_4$ at a concentration sufficient for N-doping. It was unexpectedly discovered that the ratio of nitrogen-containing precursor flow rate to the flow rate of hydrocarbon precursor is influencing the resistivity of the film in a non-linear manner. The resistivity of the film dramatically drops after a certain N:C flow rate ratio (flow rate ratio normalized for the number of nitrogen and carbon atoms in the precursors is achieved). In some embodiments, conductive N-doped carbon films are prepared by controlling the precursor flow rates such that the N:C flow rate ratio is greater than 2, preferably greater than 4. For example, when acetylene and $N_2$ are used as precursors, the flow rate of $N_2$ should preferably be at least 2 times, more preferably at least 4 times greater than the flow rate of acetylene, in order to obtain films of lowest resistivity.

The temperature at which the PECVD process is conducted, is a significant process parameter influencing film conductivity. In order to obtain a conductive carbon film, a high-temperature process is employed (as compared to conventional carbon AHM deposition temperatures of less than about 600° C.). The process temperatures for conductive film deposition, in some implementations, are between about 620 and about 670° C., e.g. are around 640° C. The process pressure in a preferred implementation is less than about 20 Torr, and more preferably ranges between about 0.5 Torr to about 8 Ton, with conductivity increasing as the pressure is decreased.

The PECVD process is preferably performed with a dual frequency radio frequency (RF) plasma generator, where the high frequency RF component is generally between about 1 and 60 MHz; in one embodiment, the HF component frequency is approximately 13.56 MHz. The LF component frequency can range between about 50 kHz and 2 MHz. A typical frequency range for LF plasma source is between about 50 kHz to 500 kHz, e.g., about 400 kHz frequency may be used. Significantly, the process for obtaining conductive carbon film is LF-dominated, such that the power ratio between LF and HF components is at least about 1, more preferably at least about 4, such as about 6 and higher. LF-dominated process allows for efficient hydrocarbon precursor decomposition to carbon of the preferred $sp^2$-dominant structure.

In another aspect of the invention, a PECVD apparatus for forming a conductive carbon film is provided. The apparatus comprises: (a) a process chamber and associated pressure control lines; (b) a work piece support for receiving and holding work pieces in the chamber during formation of the conductive carbon film thereon; (c) an inlet for receiving a process gas during formation of the conductive carbon film in the chamber; (d) a plasma generation system for generating a plasma from the process gas during formation of the conductive carbon film; and (e) a controller comprising program instructions for (i) flowing a process gas comprising a hydrocarbon precursor into the PECVD process chamber; and (ii) forming a dual frequency plasma at a process temperature of at least about 620° C. to deposit a conductive carbon film having a resistivity of less than about 0.2 Ohm-cm, wherein the deposited conductive carbon film is substantially free of $sp^3$-hybridized carbon based on IR spectrum. The apparatus controller further can include program instructions for controlling the process parameters at the ranges described above, e.g., the instructions may specify LF/HF power ratio of at least about 4, such as of at least about 6 and a process pressure of between about 0.5-8 Torr. Furthermore, the instructions may specify introducing hydrocarbon precursor and nitrogen-containing precursor at a flow rate ratio of at least about 2, such as at least about 4.

These and other features and advantages of the present invention will be described in more detail below with reference to the associated drawings.

DETAILED DESCRIPTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In one aspect of the invention, PECVD-deposited carbon films having low resistivity are provided. The films have resistivities of less than about 0.2 Ohm-cm, such as less than about 0.05 Ohm-cm, e.g., in some embodiments, from between about 0.001 Ohm-cm to about 0.01 Ohm-cm, which is comparable to resistivity of doped polysilicon. These films will be generally referred to as conductive carbon films. Provided carbon films are rich in $sp^2$-carbon, and differ both in structure and properties from conventional non-conductive $sp^3$-rich PECVD-deposited carbon.

Further, in some embodiments, provided conductive carbon films have low surface roughness due to delayed formation of crystallites in the films. Provided conductive carbon films in some embodiments have high hardness, and can exhibit etch selectivities that are comparable to etch selectivities of conventional carbon AHMs.

Conductive carbon films can be used in a variety of applications, where conductive material is desired. For example, provided carbon films can serve as electrodes in various switching elements (e.g., as gate electrodes), and as conductive layers in capacitors. Conductive carbon films can be used as both sacrificial and non-sacrificial layers in integrated circuit fabrication. When needed, provided carbon films can be conveniently removed by ashing. Other applications for conductive carbon films include anti-reflective coatings, where the conductive film can be advantageous due coutercting charge build-up, heat sinks, and low-friction coatings in MEMS devices or nanoMEMS devices.

In one aspect, provided carbon films are used as AHMs. AHMs serve as masks during lithographic patterning of underlying materials. For example, carbon AHMs are often used during patterning of underlying dielectric layers, where the AHM protects portions of dielectric, while the remaining dielectric is etched using reactive ion etching (RIE) or other etching techniques.

It was observed that conventional carbon AHMs can exhibit significant flexing during etching, because of charge build-up. The flexing and twisting of AHM can result in distortions in the formed patterns, leading to unpredictable variation of dimensions in the vias and trenches formed during etch.

In one aspect of the invention, a conductive hardmask, such as a conductive carbon hardmask, is used to overcome the problem mentioned above. A conductive carbon layer will not be subject to significant charge build-up during patterning, and can therefore reduce the distortions that occur during the etching process. In some embodiments, the conductive carbon material provided herein is used as the only layer in the hardmask. In other embodiments, the hardmask may contain multiple layers, one or more of which may be composed of the conductive carbon material. The conductive carbon material used in hardmasks typically has hardness of at least about 1.5 GPa, such as between about 3.5 GPa and 5 GPa, and an modulus of at least about 10 GPa, such as between about 22 GPa and 48 GPa. Further, the conductive carbon material used in hardmasks typically has an etch selectivity of at least about 10:1 etch rate selectivity to SiN. Unlike conventional PECVD carbon materials, the conductive carbon layers provided herein are typically not substantially optically transparent.

Advantageously, in addition to being substantially conductive, the provided films, further are characterized by low surface roughness. In some embodiments conductive carbon films have an $R_a$ value that is less than about 2 nm, such as less than about 1 nm. The low surface roughness is a significant advantage of provided carbon films, because roughness of carbon films usually increases with an increase in conductivity, and smooth conductive carbon films are challenging to obtain. In some embodiments films with resistivities of between about 0.05-0.2 Ohm-cm and $R_a$ of between about 0.4-2 nm are provided.

Figure 1:
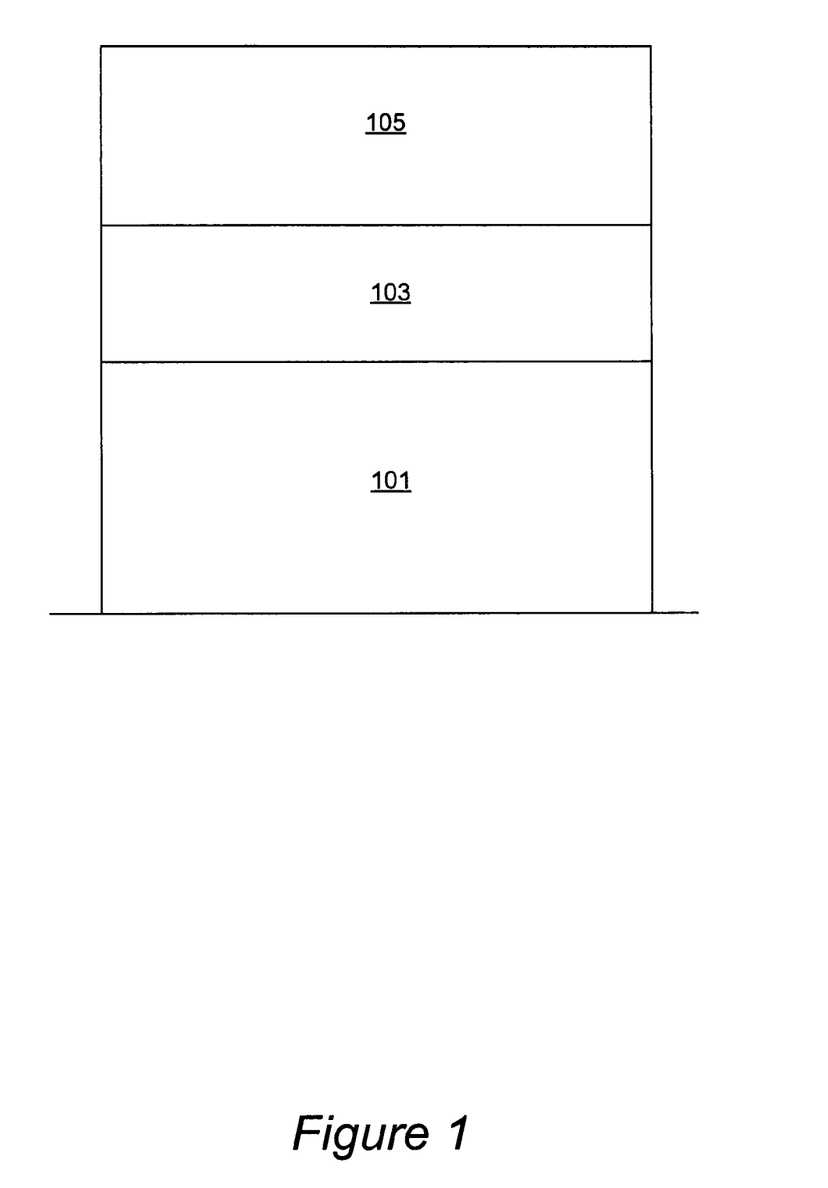
FIG. 1 shows a schematic cross sectional depiction of a partially fabricated semiconductor substrate having a conductive carbon AHM layer, in accordance with an embodiment of the invention.

An illustrative cross-sectional view of a partially fabricated semiconductor structure, which includes a conductive AHM layer is shown in FIG. 1. An illustrative process flow diagram for processing such structure is shown in FIG. 2.

The structure shown in FIG. 1 includes a layer 101, which is the layer of material that needs to be patterned. Layer 101 is typically a layer of dielectric, in which the recessed features, such as vias and/or trenches need to be etched. A variety of dielectrics may be used, including but not limited to silicon oxide based dielectrics, carbon-doped silicon oxide, silicates, porous dielectrics, organic dielectrics, etc. The dielectric layer typically has a thickness of between about 1,500-8,000 Å. On top of the dielectric layer 101 resides a layer of conductive AHM 103, which typically has a thickness of between about 5,000-20,000 Å. In some embodiments, particularly when mechanically weak ultra low-k dielectrics (e.g., dielectrics having k<2.4) are used, a thin layer of mechanically more robust dielectric may reside between the bulk layer of dielectric 101 and the AHM layer 103. This layer of mechanically robust dielectric (which may be sacrificial or non-sacrificial) can protect the mechanically weak dielectric layer from being damaged during PECVD deposition of AHM layer 103. As it was previously mentioned, AHM layer 103 may be composed of PECVD-deposited conductive carbon provided herein, or may contain several sublayers, of which one or more may include conductive carbon material.

A layer of resist material 105 suitable for lithographic patterning typically overlies the conductive AHM layer 103. Optionally, a thin layer of antireflective material (not shown), may reside between the AHM layer 103 and the resist layer 105.

Figure 2:
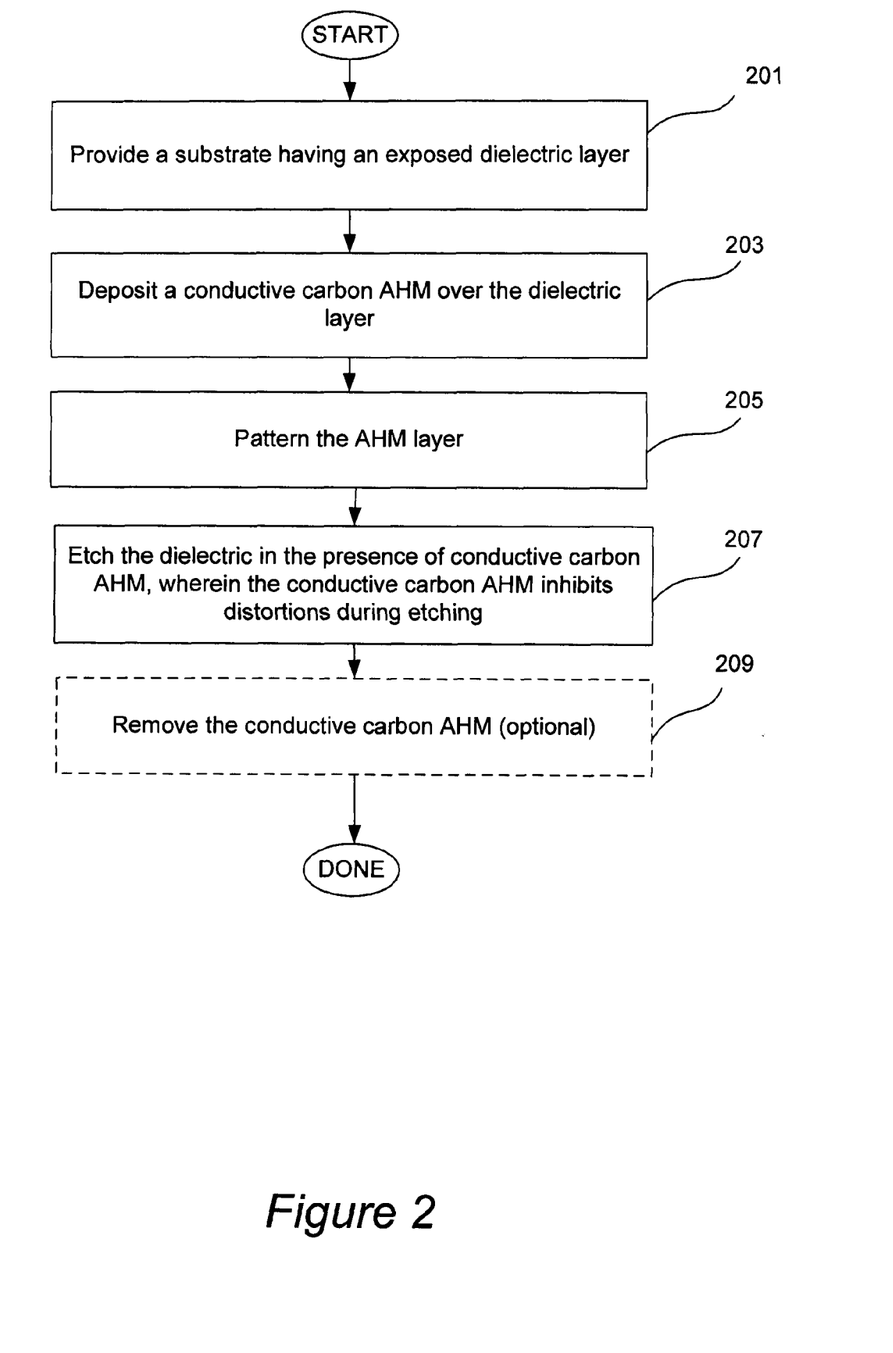
FIG. 2 is an illustrative process flow diagram for a method of processing a semiconductor substrate having a conductive carbon AHM layer, in accordance with an embodiment of the invention.

The structure shown in FIG. 1, can be used in the process flow illustrated by FIG. 2. The process starts in operation 201 by providing a substrate having an exposed dielectric layer. For example, a layer of dielectric material that needs to be patterned may be deposited by CVD (e.g., PECVD) or a spin-on method. In some embodiments a layer of more mechanically robust dielectric (e.g., of a dielectric having higher hardness than underlying dielectric) is deposited onto a layer of more mechanically weak low-k or ultra low-k dielectric. After the substrate having an exposed dielectric layer (such as layer 101) has been provided, a conductive carbon AHM layer (such as layer 103) is deposited over the layer of dielectric, in 203. The preferred method for depositing the conductive carbon AHM is PECVD. The deposition conditions for depositing the conductive carbon material will be described in detail in the subsequent sections. After the AHM layer has been formed, the AHM is patterned in operation 205, to define future recessed features. For example a layer of resist (such as layer 105) may be deposited over the conductive AHM layer, and the resist can be patterned using standard lithographic techniques, followed by patterning of the AHM layer underneath it. As a result of patterning, a structure which has portions of exposed dielectric and portions of dielectric protected with conductive AHM material, in a predetermined pattern, is formed. Next, in operation 207, the dielectric material is etched in the presence of exposed conductive carbon AHM, to define the recessed features (e.g., vias and/or trenches). Etching is performed in some embodiments using RIE with fluorine-based chemistry. The conductive AHM counteracts charge accumulation during etching, and inhibits distortions in patterning. Finally, in operation 209, the conductive AHM may be removed from the substrate, e.g., by ashing. In other embodiments, however, the conductive AHM is not a sacrificial layer and may have a dual role of a hardmask (used during fabrication) and of a conductor (functional in the final structure). In these embodiments, the conductive AHM is preserved.

Figure 3:
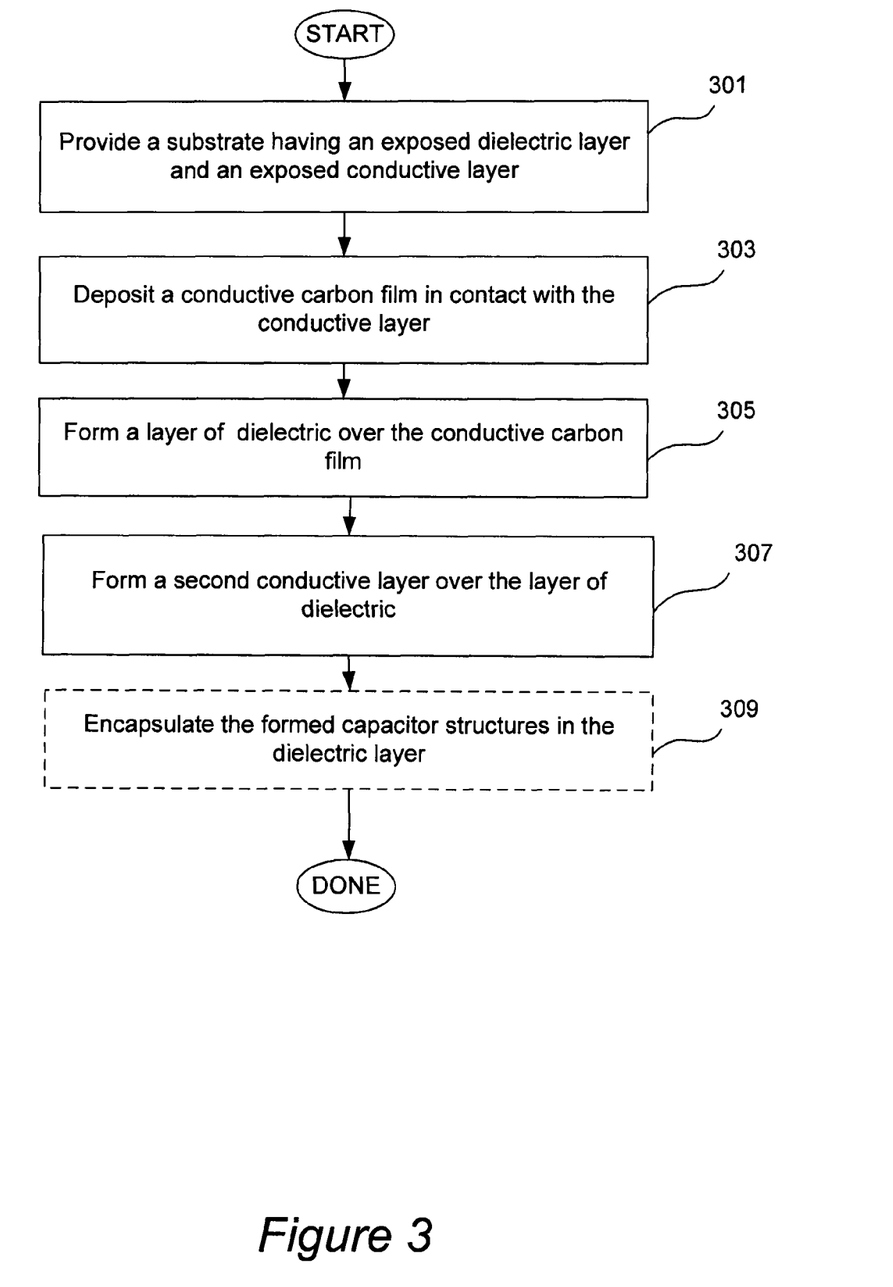
FIG. 3 is an illustrative process flow diagram for a method of fabricating a double-sided capacitor having a conductive carbon AHM layer, in accordance with an embodiment of the invention.

FIG. 3 illustrates an exemplary process flow diagram for using the conductive carbon film as a conductive element of a final structure (e.g., in a capacitor). FIGS. 4A-4G illustrate cross-sectional views of a double-sided capacitor during its fabrication process, where the double-sided capacitor includes a conductive carbon film as a functional conductive element.

Referring to operation 301, the process starts by providing a substrate having an exposed dielectric layer and an exposed conductive layer. Next, in operation 303 a conductive carbon layer is formed in contact with the conductive layer provided on the substrate. The necessary lithographic patterning steps are taken, depending on the architecture of the structure that is built. After the conductive layer has been formed, and, optionally, patterned, a layer of dielectric material (e.g., high-k metal oxide) is formed over the conductive conductive layer in operation 305. Next, a second conductive layer is formed over the layer of dielectric 307, completing the structure. Each of the layers can be patterned as needed, e.g., in order to form an array of capacitors on a substrate. In operation 309, the completed capacitor structures are encapsulated by a dielectric layer (e.g., by a silicon oxide-based dielectric).

Referring to FIGS. 4A-4G, a more detailed exemplary process flow for forming a double-sided capacitor array is illustrated.

Figure 4A:
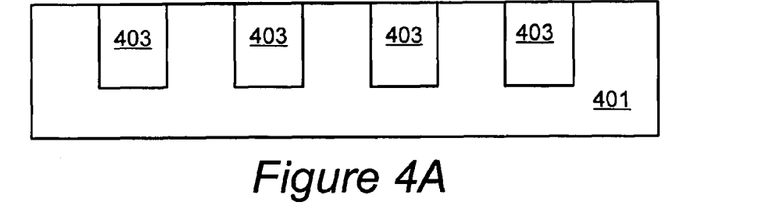
FIGS. 4A-4G show schematic cross-sectional views of a double-sided capacitor during the process of fabrication, in accordance with an embodiment of the invention.
Figure 4B:
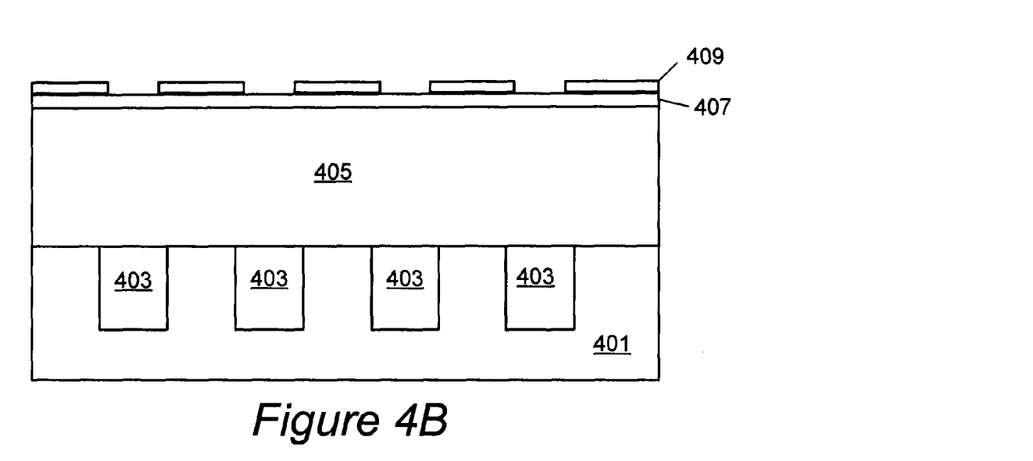

FIG. 4A shows a substrate for preparing an array of capacitors, where the substrate contains a plurality of conductive contacts 403 (e.g., contacts made of polysilicon) embedded into a layer of dielectric 403, where the dielectric may be a $SiO_2$-based dielectric. The layer shown in FIG. 4A is built over a completed bitline level (not shown). Next, a conductive carbon layer 405 is formed in contact with the conductive layer 403 provided on the substrate. The necessary lithographic patterning steps are taken, depending on the architecture of the structure that is built. Referring to the specific example shown in FIGS. 4A-4G, the deposited conductive carbon layer is shown in FIG. 4B, where the conductive carbon layer 405 is blanketly deposited over the dielectric layer 401 and over the conductive contacts 403. The conductive carbon layer for this application is usually deposited by PECVD to a thickness of between about 2,500 Å-25,000 Å. After the blanket conductive carbon layer 405 has been deposited, a thin anti-reflective layer 407 is deposited over the conductive carbon layer 405, followed by blanket deposition of resist layer 409, which is patterned to define the interior of capacitor buckets. FIG. 4B shows a structure illustrating a developed (patterned) resist layer 409 residing over an anti-reflective layer 407, which in turn resides over the conductive carbon layer 405. The recesses in the patterned resist layer have a smaller radius and/or width than the radius/width of the conductive contacts 403, so as to allow the patterned conductive carbon 405 to remain in contact with the conductors 403, upon completion of patterning.

Figure 4C:
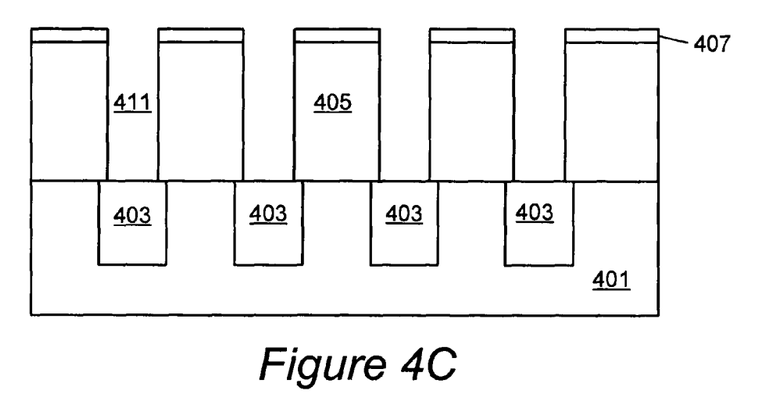
Figure 4D:
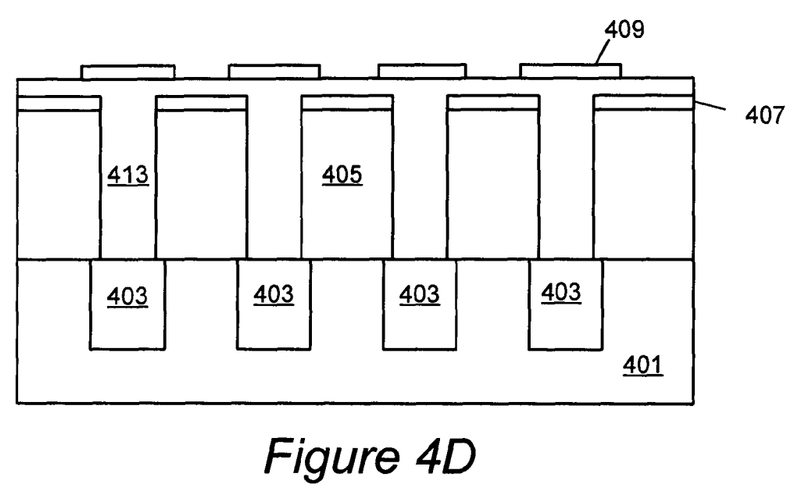
Figure 4E:
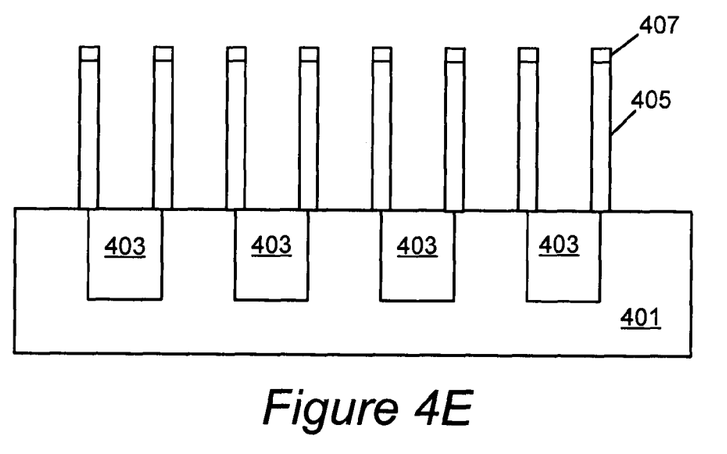
Figure 4F:
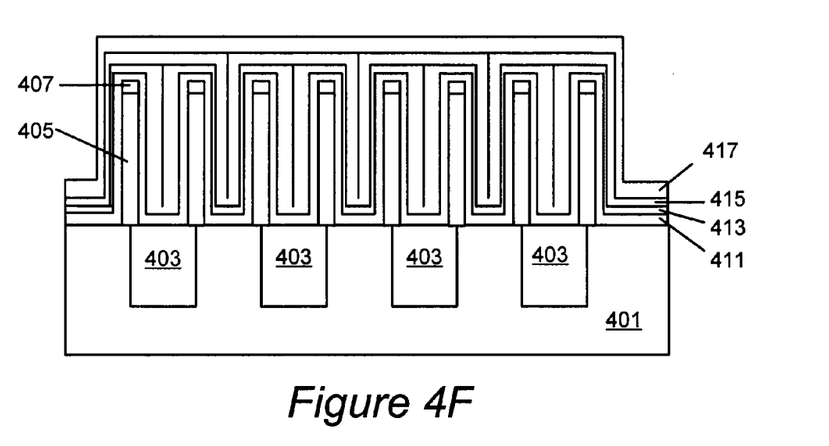
Figure 4G:
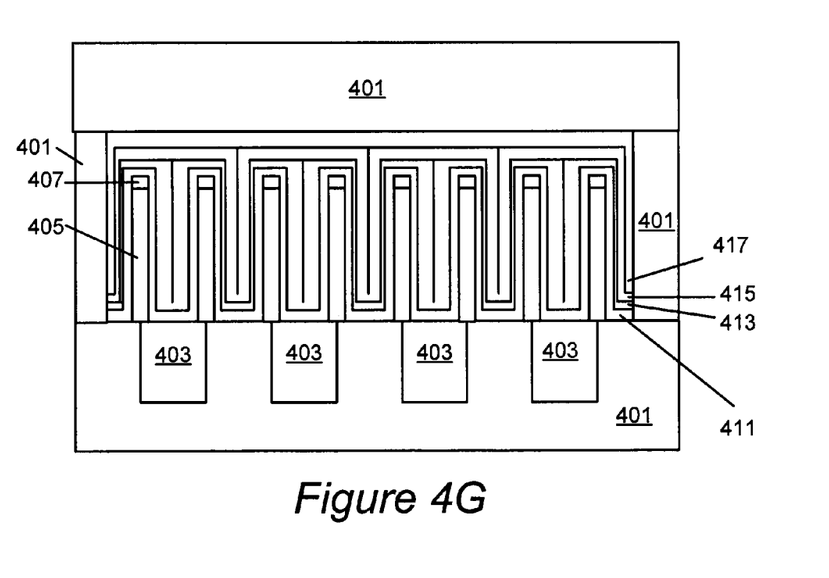
Figure 5:
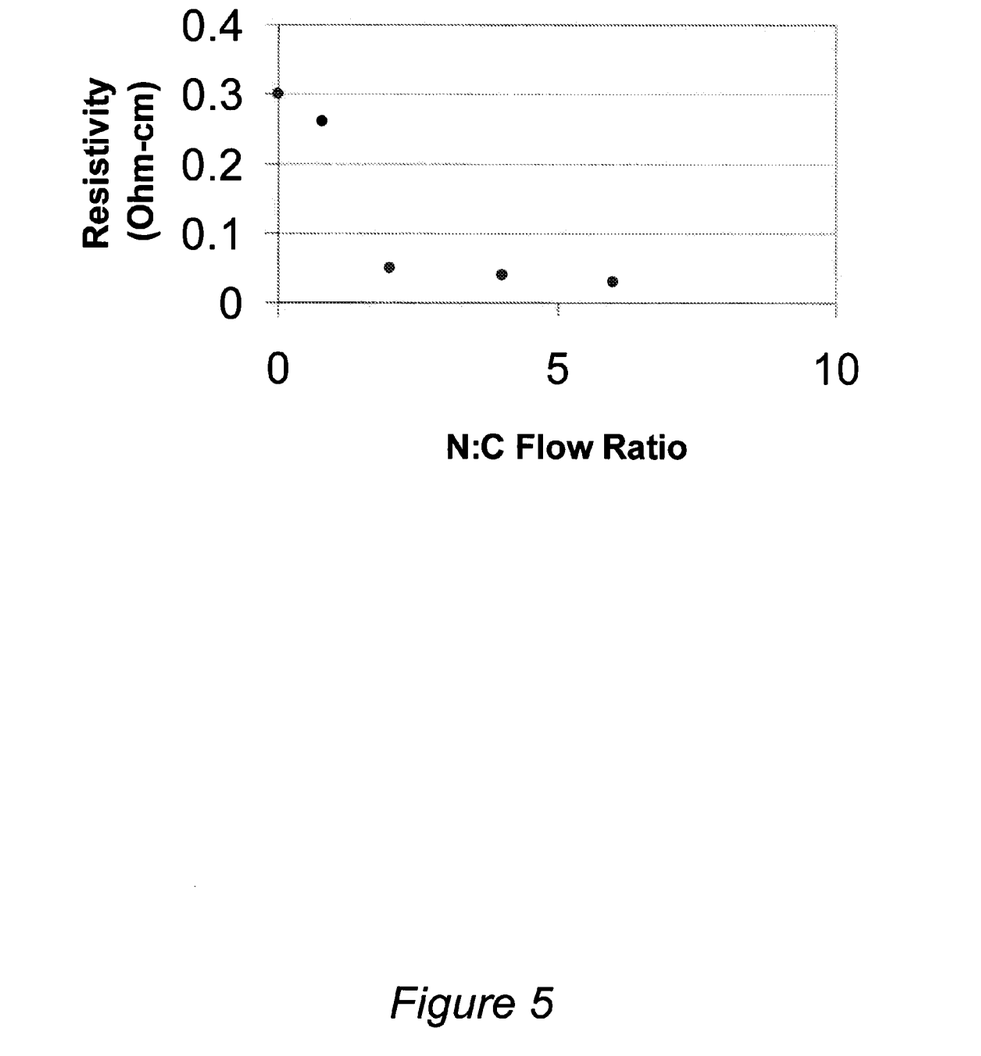
FIG. 5 is an experimental graph illustrating unexpected decrease in resistivity of a PECVD-deposited carbon film observed after a critical N/C flow rate ratio is exceeded.

Next, the conductive carbon layer 405 is patterned in a series of steps illustrated by FIGS. 4C-4E. The structure shown in FIG. 4C is obtained by a punch-through etch of an antireflective layer 407, followed by etching of the conductive carbon layer 405 (performed e.g., by $O_2$ ash/etch) to form an array of capacitor buckets 411, and followed by removal of the resist layer 409. After the interior of the buckets is formed, as shown in FIG. 4C, a new series of patterning steps is performed to define the exterior of the buckets and to define the thickness of the conductive carbon capacitor bottom plate. Referring to FIG. 4D the outside portion of capacitor buckets is defined by filling the capacitor buckets 411 with a BARC material 413, depositing a new layer of resist material 409 over the BARC layer 413, and developing the resist layer 409 to define the outside dimension of the capacitor bucket, and, consequently, the thickness of the conductive carbon bottom plate. The radius and/or width of resist mask 409 in this case should be larger than the radius and/or width of the underlying BARC plug 413. After the resist has been developed, the antireflective layer 407 and BARC layer 413 are punch-etched, and the conductive carbon layer 405 is etched to provide an array of conductive carbon bottom plates 405 shown in FIG. 4E. Subsequently, a layer of capacitor dielectric 411 is substantially conformally deposited over the substrate in contact with the conductive carbon bottom plate 405. For example, high-k dielectric materials (e.g., metal oxides such as hafnium oxide) may be deposited by CVD or MD methods to form a continuous layer over the entire array of capacitor cells. Next, capacitor metal top plate 413 is deposited as a continuous layer over the dielectric layer 411. For example, metals, such as hafnium, can be deposited by PVD, to serve as the top plate layer. Next, a conductive layer of polysilicon 415 is deposited over the metal top plate 413, typically by CVD. In some embodiments, a single conductive layer, rather than two separate layers 413 and 415 is deposited. Next, an etch stop layer 417 is formed over the polysilicon layer 415, where the etch stop layer will be used for formation of contacts to capacitors, during subsequent processing. The resulting structure is shown in FIG. 4F. Finally, the entire capacitor array is isolated by etching the capacitor array material from the periphery of the array, and by encapsulating the array in a dielectric layer 401, as shown in the final structure depicted in FIG. 4G.

It is understood that the illustrated uses for conductive carbon material, are only examples, and the material can be employed in a variety of applications where one or both of hardmask properties and conductive properties are required.

Structure of the Conductive Carbon Material

Unlike conventional PECVD-deposited carbon AHMs, the provided conductive carbon material is rich in $sp^2$ carbon. Preferably, the material has an IR spectrum that is essentially free of features that are commonly associated with $sp^3$ carbon bonding. Accordingly, in some embodiments, the IR spectra of provided material are substantially free of peaks at about between 2800-3100 $cm^{-1}$, associated with $CH_x$ stretch and are free of peaks at 2920 $cm^{-1}$ and 2850 $cm^{-1}$ associated with $sp^3$ $CH_2$, and $sp^3$ $CH_3$ bonding respectively, along with 1450 $cm^{-1}$ peak associated $Sp^a$ $CH_x$ bonding. Commonly the conductive carbon material has IR spectra with peaks at 1600 $cm^{-1}$ associated with C=C bonding and an 'elbow' or sub-peak at 1420-1460 $cm^{-1}$ associated with $sp^2=CH_2$ bonding.

The conductive carbon films provided herein may comprise hydrogen, but are preferably hydrogen-poor, e.g. with carbon content of at least about 75% atomic C and less than about 20% atomic H (e.g., less than about 10% atomic H). In a preferred embodiment, the conductive carbon film contains at least about 80% atomic C, such as about 85% C. In some embodiments, conductive carbon films are undoped and have substantially $C_xH_y$ composition. It is understood that the conductive $C_xH_y$ films may further contain up to about 5% of O derived from manipulations performed under ambient atmosphere (e.g., during measurement).

In some embodiments, the conductive carbon film is further doped with an electron donor, such as with N, P, As, or Sb. For example, nitrogen doped films, such as films having $C_xH_yN_z$, composition, where nitrogen content is between about 5-10% atomic are provided. It was discovered that incorporation of electron donors, such as nitrogen, decreases the resistivity of the carbon film, while simultaneously delaying formation of crystallites in the film, thereby leading to smoother films than the films formed without a dopant. In some embodiments, nitrogen-doped carbon films are the preferred conductive films. Similarly, oxygen (typically less than about 5%) may be present in the doped films (e.g., $C_xH_yN_z$), where the oxygen may be introduced into the film during manipulation under ambient atmosphere (e.g. during measurements performed for composition determination).

It is understood, that in general other dopants, such as oxygen may be present in the conductive carbon films. Conductive carbon films having $C_xH_yO_z$, and $C_xH_yO_zN_w$ compositions are also within the scope of the present disclosure.

Deposition Methods

The conductive carbon films provided herein are deposited by PECVD, preferably in a PECVD apparatus, which contains both LF RF and HF RF plasma generators. In a preferred embodiment of the invention, a Vector™ (e.g., C23 Vector) or Sequel™ (e.g., C2 Sequel) reactor, produced by Novellus Systems of San Jose, Calif., may be used to implement the invention.

In a typical process, a process gas comprising gaseous or vaporized precursors is introduced into the process chamber, maintained at subatmospheric pressure, and plasma is ignited at an elevated temperature to deposit the conductive carbon film on the substrate, which resides on the substrate holder inside the chamber. For example, the substrate may be a semiconductor wafer (e.g., a 200 mm, a 300 mm or 450 mm wafer) processed during IC fabrication.

In some embodiments, the conductive carbon films are formed by PECVD using a method comprising: (a) providing a semiconductor device substrate to a PECVD process chamber; (b) flowing a process fluid comprising a hydrocarbon precursor into the PECVD process chamber; and (c) forming a dual frequency plasma at a process temperature of at least about 620° C. to deposit a conductive carbon film having a resistivity of less than about 0.2 Ohm-cm.

The use of high process temperature (as compared to conventional carbon AHM deposition), the use of dual-frequency, preferably LF-dominated plasma process, and introduction of electron-donating dopants (e.g., N), are found to be the most significant contributors to obtaining carbon films with low resistivity. Further, it was observed that the resistivity significantly decreases with decreasing process pressure, thereby suggesting use of relatively low deposition pressures (preferably less than about 20 torr) for conductive carbon deposition. In addition, it was unexpectedly discovered that incorporation of the electron-donating dopant into the film, and associated drop in resistivity is not a linear function of dopant precursor flow rate, but is governed by a threshold effect. Each of the relevant process parameters and its effect on carbon film properties will be now described in further detail.

The nature of the process gas used for conductive carbon deposition can vary. In general, a variety of hydrocarbon precursors can be used in the process gas, including alkanes (e.g., methane, propane, cyclopropane, butanes, etc.), alkenes (e.g., ethylene), and alkynes (e.g., acetylene, propyne, or butyne). In some embodiments alkyne precursor (e.g., acetylene) is preferably used. The process gas may further comprise a carrier gas, e.g., an inert gas (He, Ar, Ne, or Kr) and/or $H_2$. Further, at low flow rates, $N_2$ can function as a carrier gas, while at higher flow rates it can function as an N-dopant, leading to incorporation of nitrogen into the films. Therefore, undoped conductive carbon films can be deposited by using a process gas consisting essentially of a hydrocarbon precursor, and, optionally, of a carrier gas or $N_2$ provided at a low flow rate. Typically $N_2$ does not result in substantial incorporation of nitrogen into the carbon film if N:C flow rate ratio is less than about 1.

When doped carbon film are deposited, the process gas further includes a dopant source. For example, the process gas may contain a nitrogen-containing precursor (such as $N_2$, $NH_3$, and/or $N_2H_4$) for N-doping, a phosphorus-containing precursor (e.g., phosphine) for P-doping, an As-containing precursor (e.g., arsine) for As-doping, or a Sb-containing precursor (e.g., $SbH_3$) for Sb-doping. Mixtures of doping precursors can be used to form mixed doped films in some embodiments.

It was unexpectedly discovered that incorporation of nitrogen into the carbon film leads to significant decreases in film resistivity. Further, it was observed that incorporation of nitrogen leads to films with lower surface roughness for a given resistivity value. This is particularly important because generally carbon film roughness increases with increasing film conductivity, and, therefore, conductive films having low roughness and high conductivity are particularly needed.

Nitrogen-doped films can be obtained by using a process gas comprising a hydrocarbon, a nitrogen-containing precursor, and, optionally, a carrier gas. In some embodiments, an alkyne (such as acetylene) is a preferred hydrocarbon precursor, and $N_2$ is a preferred nitrogen-containing precursor. In one embodiment, the process gas consists essentially of acetylene, $N_2$, and He. It is understood, that in other embodiments, other hydrocarbons (or mixtures of hydrocarbons) may be used as precursors, as well as other N-containing compounds (e.g., $NH_3$ and/or $N_2H_4$) may be used as N-dopants. Further, in some embodiments, a single compound containing both carbon and nitrogen (e.g., a volatile amine) can be used both as a hydrocarbon precursor and an N-dopant.

Figure 6:
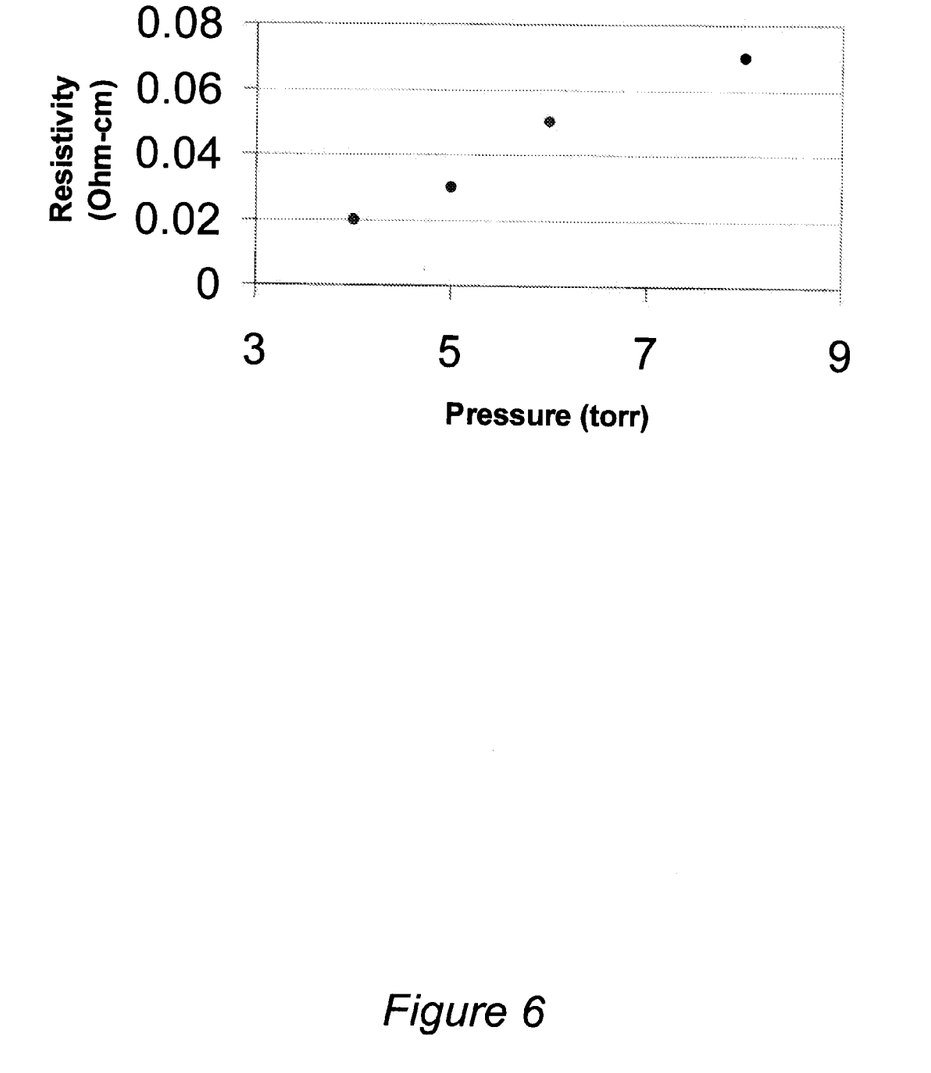
FIG. 6 is an experimental graph illustrating dependence of carbon film resistivity on deposition pressure.

Unexpectedly, it was discovered that there is a threshold effect in the dependence of carbon film resistivity on the N:C ratio in the precursor flow rates. The resistivity of the deposited N-doped carbon film sharply drops after N:C flow rate ratio exceeds a critical value. Accordingly, the deposition of N-doped conductive carbon film is preferably performed at an N:C flow rate ratio that is above the critical value. FIG. 6 is an experimental graph which illustrates a threshold effect of N:C flow rate ratio on carbon film resistivity for a process gas containing $N_2$ and acetylene ($C_2H_2$), where the carbon films were deposited at 650° C. and at a pressure of 6 torr. For $N_2$ and $C_2H_2$, which contain the same number of carbon and nitrogen atoms, the N:C ratio is 1, when the flow rates of $N_2$ and $C_2H_2$ are the same.

It can be seen that at zero nitrogen flow (N:C=0), an undoped carbon film having a resistivity of 0.3 Ohm-cm is obtained. Introduction of $N_2$ at 1:1 N:C flow rate ratio decreases the resistivity only insignificantly. However, there is a significant (greater than 3-fold) drop in resistivity observed after the N:C ratio exceeds a critical value of about 2. Therefore, in some embodiments the conductive carbon film is deposited by introducing a hydrocarbon precursor and a nitrogen-containing precursor at N:C flow rate ratio of 2 and greater, such as at flow rate ratio of 3 and greater. For example, in some embodiments the flow rate of $N_2$ is at least 2 times, preferably at least 3 times greater than the flow rate of acetylene. This effect was unexpected, because conventional non-conductive carbon AHMs are typically deposited without using high $N_2$ flow rates, e.g., during conventional AHM deposition N:C flow rate ratios are usually not greater than 1.5, and $N_2$ is used primarily as a carrier gas. There was no indication that higher N:C flow rate ratios would lead to sharp improvements in film conductivity, which were unexpectedly observed.

It is understood that while in many embodiments the conductive carbon films provided herein are preferably N-doped, with N content of greater than about 5% atomic, in other embodiments, the conductive carbon films are undoped. Generally, conductive carbon films containing other dopants, such as oxygen, and films containing two or more dopants (e.g., nitrogen and oxygen simultaneously) are also within the scope of this invention.

Deposition of both doped and undoped conductive carbon films involves careful selection of such process parameters as temperature, pressure, and LF/HF power ratio.

The temperature at which the PECVD process is conducted, is a significant process parameter influencing film conductivity. In order to obtain a conductive carbon film, a high-temperature process is employed (as compared to conventional carbon AHM deposition temperatures of less than about 600° C.). The process temperatures for conductive film deposition, in some implementations, are between about 620 and about 670° C., e.g. are around 640° C. Lower deposition temperatures usually result in films with significantly lower conductivities.

The process pressure, in some embodiments, is controlled to be lower than about 20 ton, preferably in the range of between about 0.5 Ton to about 8 Torr. It was observed that the conductivity of carbon films is increasing as the pressure decreases. This effect is illustrated, for example, in FIG. 6, which is an experimental plot illustrating carbon film resistivities as a function of process pressure. The data were obtained for nitrogen-doped carbon films deposited at a process temperature of 640° C.

The PECVD process is preferably performed with a dual frequency radio frequency (RF) plasma generator, where the high frequency RF component is generally between about 1 and 60 MHz; in a preferred embodiment, the HF component frequency is approximately 13.56 MHz. The LF component frequency can range between about 100 kHz and 2 MHz. A typical frequency range for LF plasma source is between about 50 kHz to 500 kHz, e.g., about 400 kHz frequency may be used. Significantly, the process for obtaining conductive carbon film is preferably LF-dominated, such that the power ratio between LF and HF components is at least about 1, more preferably is at least about 4, such as about 6 and higher. LF-dominated process allows for efficient hydrocarbon precursor decomposition to carbon of the preferred $sp^2$-dominant structure.

Tables 1-4 illustrate exemplary deposition process conditions for depositing N-doped conductive carbon films (Table 1 and Table 2) and for depositing undoped conductive carbon films. Tables 1 and 3 illustrate process conditions preferred in some embodiments, while Tables 3 and 4 show specific experimental process conditions for two deposited films.

It is understood that such parameters as precursor flow rates and total power levels for HF RF and LF RF generators, are dependent on the size of the process chamber, and can be easily scaled for a specific chamber/substrate size. The parameters shown in Tables 1-4 refer to a process chamber housing four 300 mm wafers.

TABLE 1

PECVD process parameters for deposition of nitrogen-doped conductive carbon films in accordance with some embodiments of the invention.

| | |
|---|---|
| Process Gas Composition | $C_2H_2$ (1000-4000 sccm); $N_2$ (1500-18000 sccm); He (1000-8000 sccm). |
| N/C flow rate ratio | Greater than 2, preferably about 3-10 |
| Temperature | About 620-670° C., preferably about 630-660° C. |
| Pressure | Less than about 20 torr, preferably about 0.5-8 Torr |
| HF power | 250-750 W; |
| LF power | 1000-2500 W; |
| LF/HF power ratio | Greater than 1, preferably greater than 4, e.g., greater than 6. |

TABLE 2

Experimental PECVD process parameters for deposition of nitrogen-doped conductive carbon films in accordance with one example.

| | |
|---|---|
| Process Gas Composition | $C_2H_2$ (2500 sccm); $N_2$ (15 000 sccm); He (2,000 sccm). |
| N/C flow rate ratio | 6 |
| Temperature | 640° C. |
| Pressure | 1 Torr |
| HF power (at 13.56 MHz) | 350 W; |
| LF power (at 400 kHz) | 2200 W; |
| LF/HF power ratio | 6.2 |
| Resistivity | 0.005 Ohm-cm |
| Ra | 0.44 |

TABLE 2-continued

Experimental PECVD process parameters for deposition of nitrogen-doped conductive carbon films in accordance with one example.

| | |
|---|---|
| Rmax | 5 |
| Film Composition | C 85%, H 7%, N 8% No $sp^3$ carbon based on IR spectrum |

TABLE 3

PECVD process parameters for deposition of undoped conductive carbon film in accordance with some embodiments of the invention.

| | |
|---|---|
| Process Gas Composition | $C_2H_2$ (1000-4000 sccm); He (1000-8000 sccm). |
| N/C flow rate ratio | Greater than 2, preferably about 3-10 |
| Temperature | About 620-670° C., preferably about 630-660° C. |
| Pressure | Less than about 20 torr, preferably about 0.5-8 Torr |
| HF power | 250-750 W; |
| LF power | 1000-2500 W; |
| LF/HF power ratio | Greater than 1, preferably greater than 4. |

TABLE 4

Experimental PECVD process parameters for deposition of undoped conductive carbon film in accordance with one example.

| | |
|---|---|
| Process Gas Composition | $C_2H_2$ (2500 sccm); He (2000 sccm). |
| N/C flow rate ratio | 0 |
| Temperature | 650° C. |
| Pressure | 6 Torr |
| HF power | 350 W; |
| LF power | 2200 W; |
| LF/HF power ratio | 6.2 |
| Resistivity | 0.2 Ohm-cm |
| Ra | 0.33 |
| Rmax | 4.7 |
| Film Composition | C 80%, H 18%, N 0%, O 2% |

Apparatus

The deposition of conductive carbon film is preferably implemented in a plasma PECVD reactor, which uses capacitively coupled plasma. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing carbon layer deposition is transferred from one station to another within a reactor chamber during the process. For example, for a 400 Å carbon film deposition, 100 Å of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. The apparatus further typically will include a heater such as a heating plate, and an associated controller configured for maintaining the temperature in the preferred range.

Figure 7:
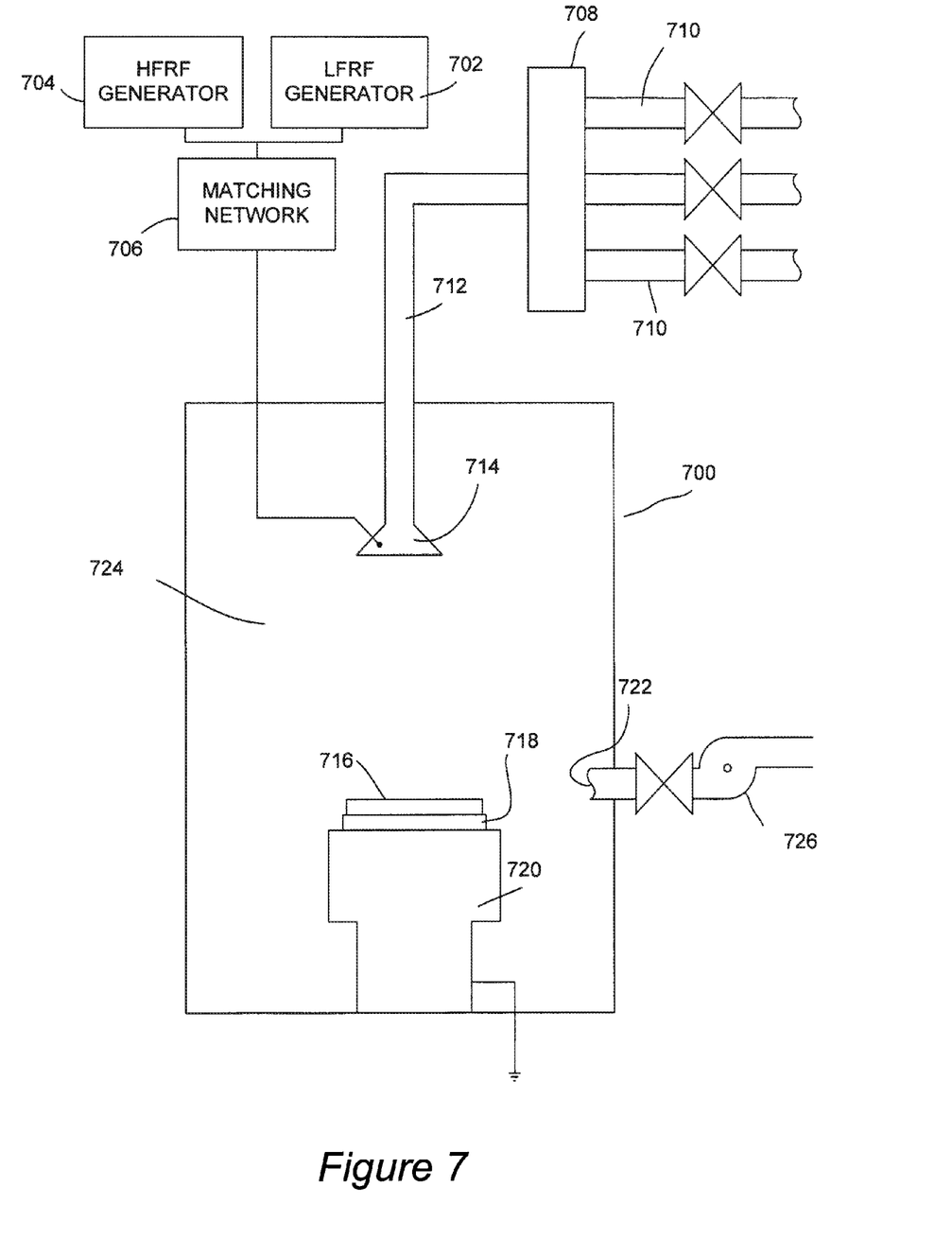
FIG. 7 is a schematic depiction of a PECVD apparatus that is suitable for deposition of a conductive carbon layer in accordance with embodiments provided herein.

FIG. 7 provides a simple block diagram depicting various reactor components arranged for implementing the present invention. As shown, a reactor 700 includes a process chamber 724, which encloses other components of the reactor and serves to contain the plasma generated by a capacitor type system including a showerhead 714 working in conjunction with a grounded heater block 720. A high-frequency RF generator 702, connected to a matching network 706, and a low-frequency RF generator 704 are connected to showerhead 714. The power and frequency supplied by matching network 706 is sufficient to generate a plasma from the process gas.

Within the reactor, a wafer pedestal 718 supports a substrate 716. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 712. Multiple source gas lines 710 are connected to manifold 708. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 700 via an outlet 722. A vacuum pump 726 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The deposition of carbon film may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition until all the required depositions are completed, or multiple depositions can be conducted at a single station before indexing the wafer.

In certain embodiments, a system controller (not shown) is employed to control process conditions during deposition of the carbon film, insert and remove wafers, etc. The controller will typically include one or more memory devices and one or more processors.

The processor may include a CPU or computer, analog and/or digital input/output connections, stepper motor controller boards, etc.

In certain embodiments, the controller controls all of the activities of the deposition apparatus. The system controller executes system control software including sets of program instructions for controlling the timing, mixture of gases, chamber pressure, chamber temperature, wafer temperature, RF power levels, wafer chuck or susceptor position, and other parameters of a particular process. For example, instructions specifying flow rates of hydrocarbon precursor and nitrogen for carbon film deposition may be included. In general, instructions may comprise instructions for process conditions for any of the processes described in the previous sections. The controller may comprise different or identical instructions for different apparatus stations, thus allowing the apparatus stations to operate either independently or synchronously.

Other computer programs stored on memory devices associated with the controller may be employed in some embodiments.

Typically there will be a user interface associated with controller. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, etc. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. A plasma control program may include code for setting RF power levels applied to the process electrodes at the target and the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

What is claimed is:

1. A method of depositing a conductive carbon film on a partially fabricated semiconductor device substrate, the method comprising:
   (a) providing a semiconductor device substrate to a PECVD process chamber;
   (b) flowing a process gas comprising a hydrocarbon precursor into the PECVD process chamber;
   (c) forming a dual frequency plasma at a process temperature of between about 620-670° C. to deposit a conductive carbon film having a resistivity of not greater than about 0.2 Ohm-cm, wherein the deposited conductive carbon film is substantially free of $sp^3$-hybridized carbon based on IR spectrum, as evidenced by absence of peaks at 2920 $cm^{-1}$, 2850 $cm^{-1}$, and 1450 $cm^{-1}$ associated with $sp^3$ bonding.

2. The method of claim 1, wherein the conductive carbon film is deposited onto a layer of exposed dielectric material, and wherein the conductive carbon film is an ashable hardmask (AHM) layer.

3. The method of claim 2, further comprising etching the dielectric in the presence of exposed conductive AHM.

4. The method of claim 2, further comprising removing the conductive AHM by ashing.

5. The method of claim 1, wherein the conductive carbon film is an electrode.

6. The method of claim 1, wherein depositing the conductive carbon film forms at least a part of a component selected from the group consisting of a transistor gate electrode, a capacitor electrode, a conductive anti-reflective coating, and a low-friction coating of a MEMS device or a nanoMEMS device.

7. The method of claim 1, wherein the conductive carbon film comprises carbon and hydrogen, and wherein the film contains at least about 75% atomic C and less than about 20% atomic H.

8. The method of claim 7, wherein the conductive carbon film contains at least about 80% atomic C.

9. The method of claim 1, wherein the conductive carbon film further comprises an electron donor.

10. The method of claim 9, wherein the electron donor is nitrogen, and wherein the conductive carbon film has a composition CxHyNz, wherein nitrogen content is between about 5-10% atomic.

11. The method of claim 1, wherein the conductive carbon film has a resistivity of less than about 0.05 Ohm-cm.

12. The method of claim 1, wherein the conductive carbon film is deposited at a pressure of between about 0.5-8 Torr.

13. The method of claim 1, wherein the LF/HF power ratio during deposition of the conductive carbon film is at least about 6.

14. The method of claim 1, wherein the process gas further comprises an inert gas.

15. The method of claim 1, wherein the process gas further comprises a nitrogen source, provided at N:C flow rate ratio of at least about 2.

16. The method of claim 1, wherein the nitrogen source is $N_2$.

17. The method of claim 1, wherein the hydrocarbon is acetylene.

18. The method of claim 1, wherein the deposited conductive carbon film is a smooth conductive carbon film having an Ra value of less than about 2 nm.

* * * * *